US007128622B2

(12) United States Patent
Tsai (10) Patent No.: US 7,128,622 B2
(45) Date of Patent: Oct. 31, 2006

(54) ELECTRICAL CONNECTOR WITH A SOLDER BALL LOCKING STRUCTURE

(76) Inventor: Chou Hsuan Tsai, 15F,No. 4, Lane 127, Sec. 1, Fu-Hsing Rd., Hsin-Chuang City, Taipei Hsien (TW)

( * ) Notice: Subject to any disclaimer, the term of this patent is extended or adjusted under 35 U.S.C. 154(b) by 0 days.

(21) Appl. No.: 11/252,693

(22) Filed: Oct. 17, 2005

(65) Prior Publication Data

US 2006/0084328 A1 Apr. 20, 2006

(51) Int. Cl.
*H01R 4/02* (2006.01)
*H01R 11/01* (2006.01)
(52) U.S. Cl. .................... 439/874; 439/66; 439/83
(58) Field of Classification Search ........... 439/66, 439/70, 71, 83, 874, 875, 876
See application file for complete search history.

(56) References Cited

U.S. PATENT DOCUMENTS 6,572,397 B1* 6/2003 Ju ............................ 439/342
6,755,667 B1* 6/2004 Lin ............................ 439/83
6,769,924 B1* 8/2004 Korsunsky et al. ........... 439/83
6,843,662 B1* 1/2005 Ju ............................... 439/83
2006/0030180 A1* 2/2006 Tsai ............................ 439/83

* cited by examiner

*Primary Examiner*—James R. Harvey
(74) *Attorney, Agent, or Firm*—Pro-Techtor Int'l Services (57) ABSTRACT

An electrical connector includes a base, solder balls, terminals and locking members. The base is formed with terminal slots and solder ball slots. The terminal slots respectively communicate with the solder ball slots via channels. The solder balls are respectively disposed in the solder ball slots. Each solder ball has a bottom protruding beyond a bottom of the base. Each ball contacts a bottom surface of the solder ball slot disposed between the terminal slot and the solder ball. The terminals are respectively disposed in the terminal slots and electrically connected to the solder balls. The terminals have contacts extending in a direction toward tops of the terminal slots. The locking members are separated from the terminals and respectively inserted into the solder ball slots. Each locking member locks up at one side of the solder ball to prevent the solder ball from escaping out of the solder ball slot.

5 Claims, 12 Drawing Sheets

ELECTRICAL CONNECTOR WITH A SOLDER BALL LOCKING STRUCTURE

BACKGROUND OF THE INVENTION

1. Field of the Invention

The invention relates in general to an electrical connector, and more particular to an electrical connector with a solder ball locking structure.

2. Description of the Related Art

Figure 1:
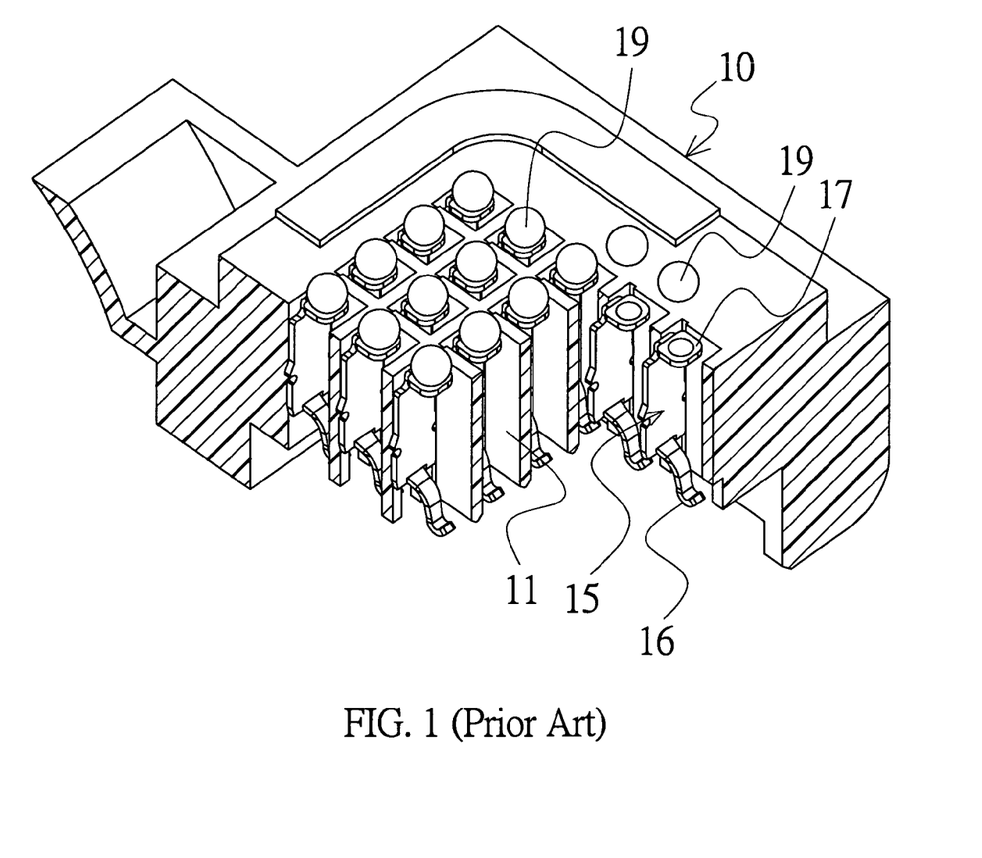
FIG. 1 is a pictorial view showing a conventional electrical connector having a solder ball connecting structure.

Referring to FIG. 1, a conventional electrical connector includes a base 10 and a plurality of terminals 15. The base 10 has a plurality of terminal slots 11. The terminals 15 are disposed in the terminal slots 11, respectively. Each terminal 15 has one end formed with a contact 16 and the other end formed with a horizontal connecting piece 17. The middle of the connecting piece 17 is concave and formed with a cup to which a solder ball 19 is bonded.

The above-mentioned structure has the following drawbacks.

First, a flux is applied to the connecting pieces 17, and then the solder balls 19 are respectively disposed on the connecting pieces 17 through a jig in an aligned manner. Thus, the manufacturing processes are too complicated.

Second, the bottom of the solder ball 19 is bonded to the horizontal connecting piece 17. Because the bonding point is located at the bottom, no circumferential wall for positioning the solder ball should be formed on the base 10 around the solder ball 19 because the circumferential wall isolates heat and is disadvantageous to the hot bonding process. Thus, only the cup can be formed at the middle of the connecting piece 17 such that the solder ball can be placed in the cup. However, the method of positioning the solder ball is not stable enough. In particular, when the solder ball connection points of the connector are getting denser and denser, the solder balls and the cups of the connecting pieces are getting smaller and smaller, and the poor positioning effect of the solder balls on the connecting pieces 17 is getting more and more obvious.

Third, no block portion is disposed around each solder ball, so the short-circuited phenomenon between two adjacent solder balls occurs when the gap between the solder balls is quite small.

SUMMARY OF THE INVENTION

It is therefore an object of the invention to provide an electrical connector with a solder ball locking structure, wherein a connecting piece of a terminal directly contacts a solder ball, and then a locking member locks up at a side of the solder ball. Thus, no bonding process has to be performed to fix the solder ball, and the terminal may be directly connected to the solder ball such that a good electrical connection effect may be obtained.

Another object of the invention is to provide an electrical connector with a solder ball locking structure, wherein a solder ball can be surrounded by a solder ball slot when the solder ball is placed, such that the solder ball may be firmly positioned and the short-circuit phenomenon between two adjacent solder balls may be avoided.

Still another object of the invention is to provide an electrical connector with a solder ball locking structure, wherein a terminal may be directly connected to a solder ball to obtain a good electrical connection effect.

To achieve the above-identified objects, the invention provides an electrical connector including a base, solder balls, terminals and locking members. The base is formed with terminal slots and solder ball slots. The terminal slots respectively communicate with the solder ball slots via channels. The solder balls are respectively disposed in the solder ball slots. Each solder ball has a bottom protruding beyond a bottom of the base. Each of the solder balls is disposed on and in contact with a bottom surface of the solder ball slot, and the bottom surface of the solder ball slot is disposed between the terminal slot and the solder ball. The terminals are respectively disposed in the terminal slots and electrically connected to the solder balls. The terminals have contacts extending in a direction toward tops of the terminal slots. The locking members are separated from the terminals and respectively inserted into the solder ball slots. Each locking member locks up at one side of the solder ball to prevent the solder ball from escaping out of the solder ball slot.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 2:
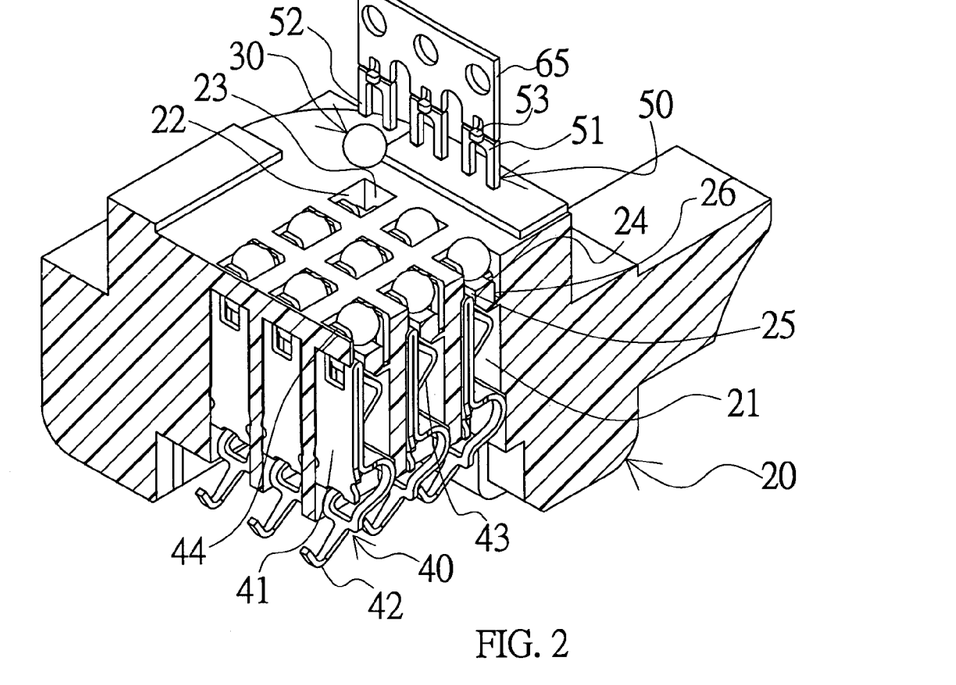
FIG. 2 is a pictorially exploded view showing an electrical connector according to a first embodiment of the invention.
Figure 3:
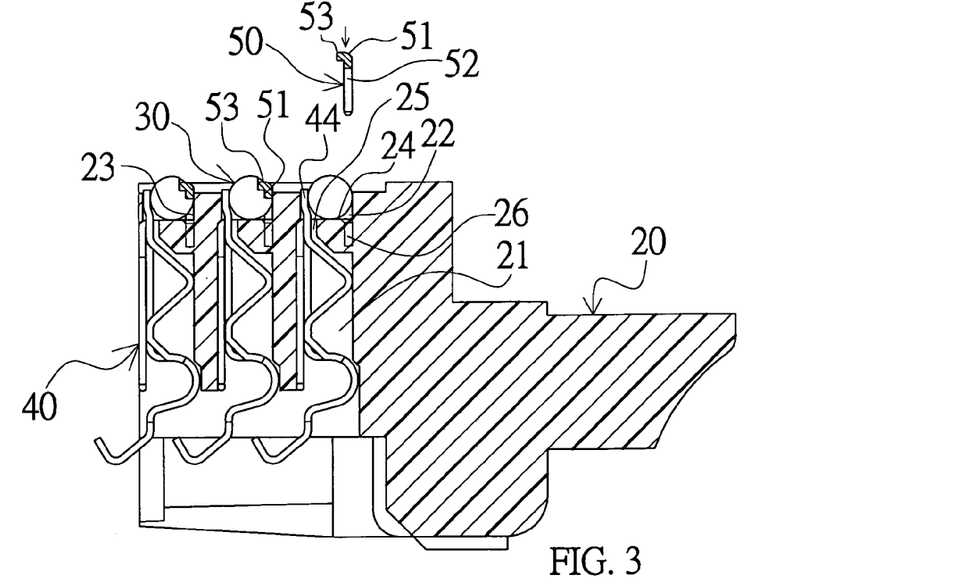
FIG. 3 is a cross-sectional view showing the electrical connector according to the first embodiment of the invention.

Referring to FIGS. 2 and 3, an electrical connector of the invention includes a base 20, solder balls 30, terminals 40 and locking members 50.

The base 20 is formed with terminal slots 21 and solder ball slots 22. Each solder ball slot 22 is located under the terminal slot 21. The solder ball slot 22 has a circumferential wall 23 and a bottom surface 24 for separating the solder ball slot 22 from the terminal slot 21. The terminal slot 21 communicates with the solder ball slot 22 at a side through a channel 25. The solder ball slot 22 is formed with a cavity 26 on a bottom surface of the other side.

Each solder ball 30 is disposed in the solder ball slot 22 and rests on the circumferential wall 23. A bottom of each solder ball 30 protrudes beyond the bottom of the base 20. Each of the solder balls 30 is disposed on and in contact with a bottom surface 24 of the solder ball slot 22, and the bottom surface 24 of the solder ball slot 22 is disposed between the terminal slot 21 and the solder ball 30.

The terminals 40 are respectively disposed in the terminal slots 21. Each terminal 40 has a fixing portion 41 and a contact 42. The fixing portion 41 includes two folded plates. A pressing portion 43 pressing against the terminal slot 21 is formed on an upper portion of the fixing portion 41 by way of pressing. A connecting piece 44, which extends to the solder ball slot 22 via the channel 25 to contact the solder ball 30, is formed on a lower portion of the fixing portion 41 by way of pressing. The contact 42 extends in a direction toward a top of the terminal slot 21.

The locking member 50 has an inverse U shape and has a transversal part 51 and two longitudinal parts 52 connected to the transversal part 51. A projection 53 protruding toward the solder ball is formed at a middle of the transversal part 51. Each locking member 50 which is separated from its corresponding terminal 40 and inserted into the solder ball slot 22 rests on the circumferential wall 23 of the connecting piece 44, and the transversal part 51 and the projection 53 intrude into the solder ball 30 and lock up at one side of the solder ball 30 so as to prevent the solder ball 30 from escaping out of the solder ball slot 22. In addition, the longitudinal parts 52 are inserted into and fixed in the cavity 26.

The method of manufacturing the above-mentioned structure includes the following steps.

Figure 4:
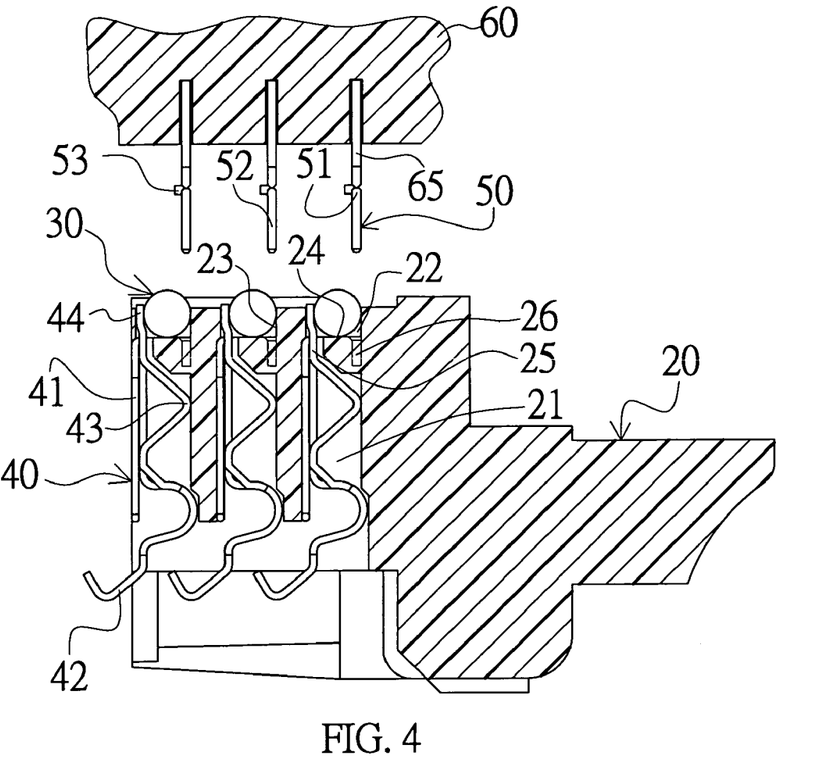
FIG. 4 is a schematic illustration showing a procedure of manufacturing the electrical connector according to the first embodiment of the invention.

As shown in FIG. 4, a base 20 formed with a plurality of terminal slots 21 and a plurality of solder ball slots 22 is provided. Each solder ball slot 22 corresponds to and is located under the terminal slot 21. The solder ball slot 22 has a circumferential wall 23 and a bottom surface 24 for separating the terminal slot 21 from the solder ball slot 22. The terminal slot 21 communicates with the solder ball slot 22 at a side through a channel 25. The solder ball slot is formed with a cavity 26 on a bottom surface at the other side.

Then, a plurality of terminals 40 is disposed in the plurality of terminal slots 21. The terminal 40 has a fixing portion 41 and a contact 42. The fixing portion 41 has two folded plates. A pressing portion 43 pressing against the terminal slot 21 is formed on an upper portion of the fixing portion 41 by way of pressing. A connecting piece 44, which extends to the solder ball slot 22 via the channel 25 to contact a solder ball 30, is formed on a lower portion of the fixing portion 41 by way of pressing. The contact 42 extends in a direction toward a top of the terminal slot 21.

Next, the plurality of solder balls 30 is disposed in the solder ball slots 22. The bottom of each solder ball 30 protrudes beyond the bottom of the base 20.

Then, a plurality of locking members 50 having inverse U shapes is provided. The locking member 50 has a transversal part 51 and two longitudinal parts 52 connected to the transversal part 51. A projection 53 protruding toward the solder ball is formed at a middle of the transversal part 51.

One row of locking members 50 is connected to a material tape 65, and multiple rows of locking members 50 are arranged in a jig 60. The jig 60 is pressed to tightly insert the rows of locking members 50 into the solder ball slots 22. Each locking member 50 rests on the circumferential wall 23 of the connecting piece 44. The transversal part 51 and the projection 53 intrude into the solder ball 30 and lock up at one side of the solder ball 30 so as to prevent the solder ball 30 from escaping out of the solder ball slot 22. In addition, the solder ball 30 is tightly pressed against the connecting piece 44, and the longitudinal part 52 is inserted into and fixed in the cavity 26.

Figure 5:
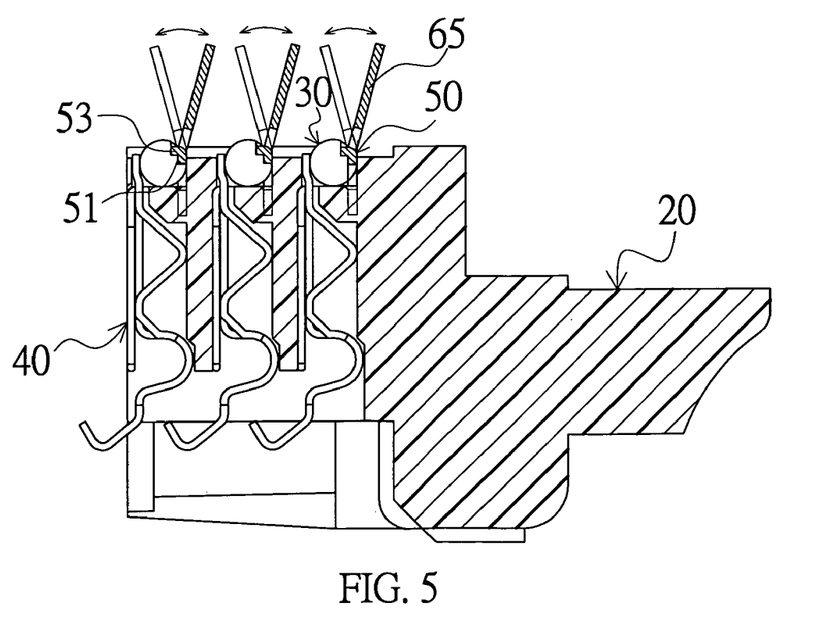
FIG. 5 is a schematic illustration showing another procedure of manufacturing the electrical connector according to the first embodiment of the invention.

As shown in FIG. 5, the material tapes 65 are broken to finish the facture.

Figure 6:
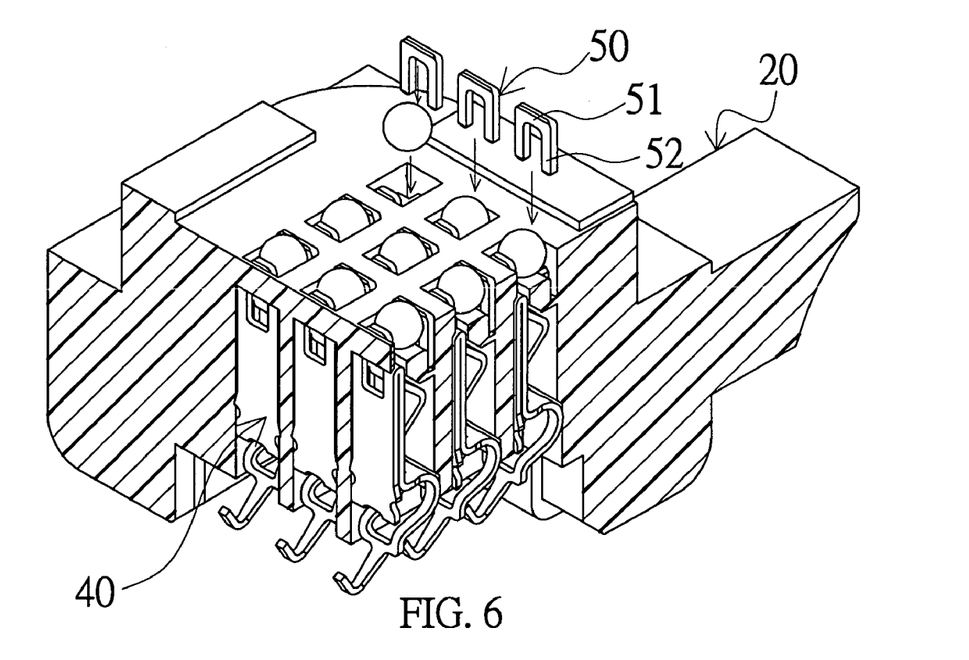
FIG. 6 is a pictorially exploded view showing an electrical connector according to a second embodiment of the invention.
Figure 7:
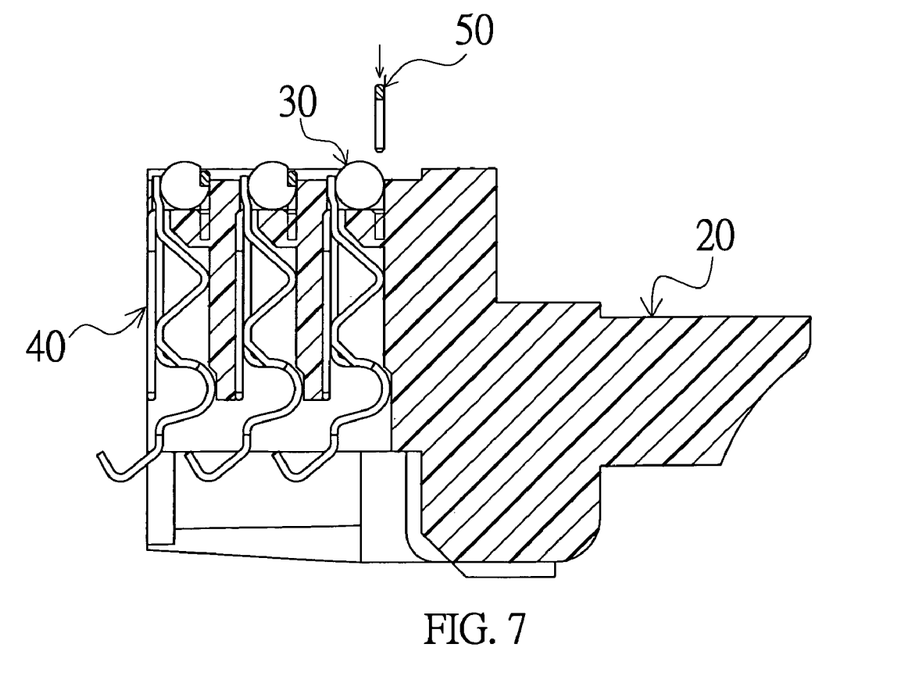
FIG. 7 is a cross-sectional view showing the electrical connector according to the second embodiment of the invention.

As shown in FIGS. 6 and 7, the second embodiment of the invention is almost the same as the first embodiment except that the locking member 50 has no projection.

Figure 8:
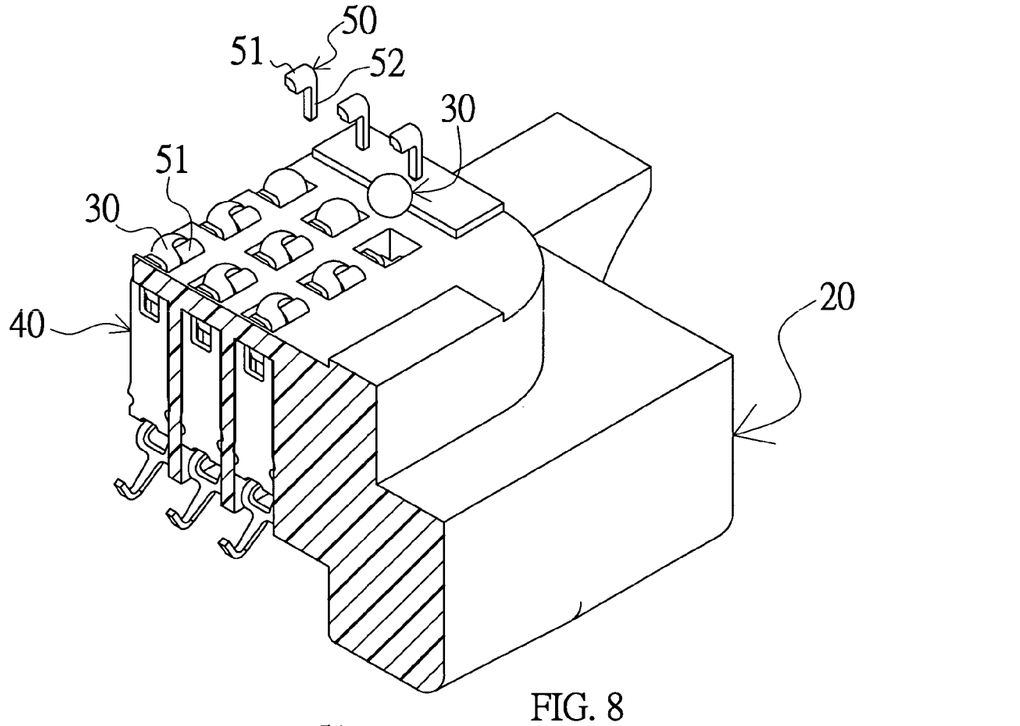
FIG. 8 is a pictorially exploded view showing an electrical connector according to a third embodiment of the invention.
Figure 9:
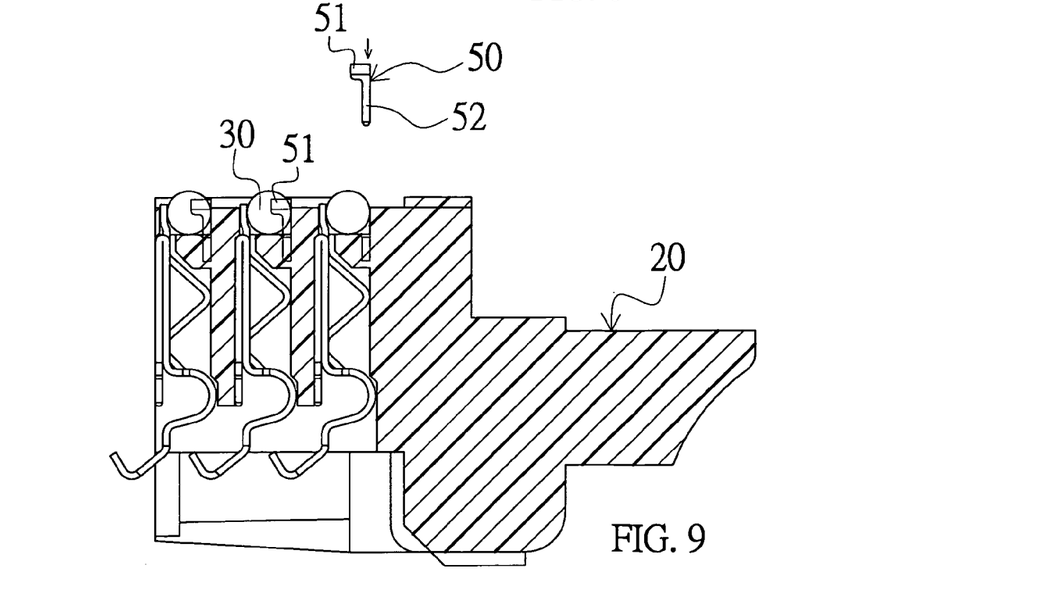
FIG. 9 is a cross-sectional view showing the electrical connector according to the third embodiment of the invention.

As shown in FIGS. 8 and 9, the third embodiment of the invention is almost the same as the first embodiment except that the locking member 50 has an L shape and includes a transversal part 51 and a longitudinal part 52. The transversal part 51 intrudes into the solder ball 30 and locks up at one side of the solder ball 30.

Figure 10:
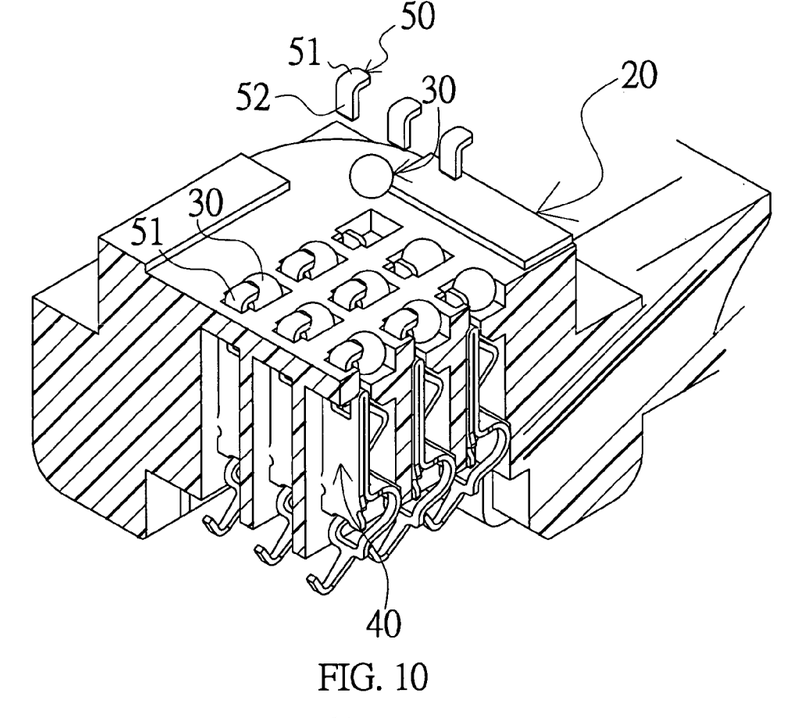
FIG. 10 is a pictorially exploded view showing an electrical connector according to a fourth embodiment of the invention.
Figure 11:
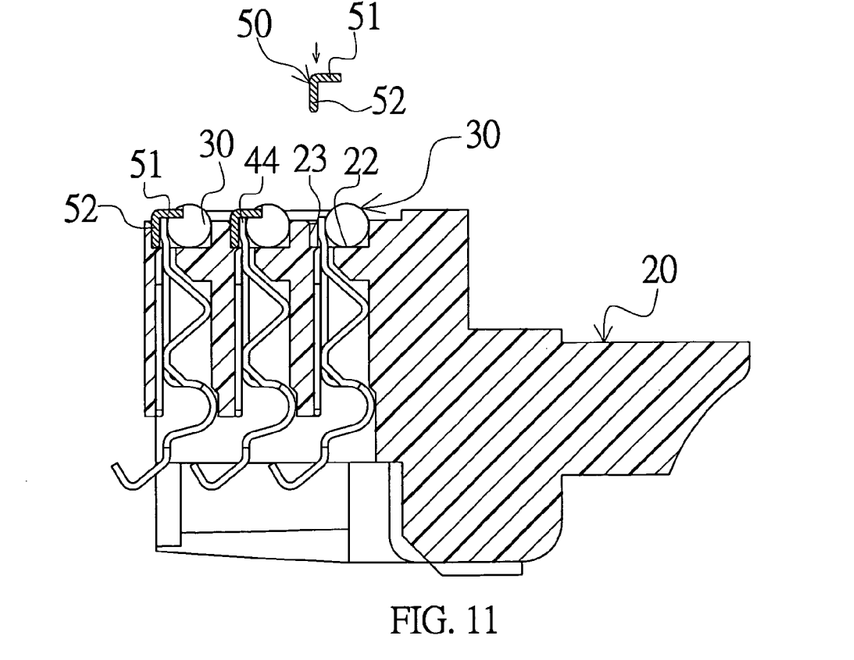
FIG. 11 is a cross-sectional view showing the electrical connector according to the fourth embodiment of the invention.

As shown in FIGS. 10 and 11, the fourth embodiment of the invention is almost the same as the third embodiment except that the longitudinal plate 52 of the locking member 50 tightly presses against a sidewall 23 of the solder ball slot 22 and the connecting piece 44 of the terminal 40 and is located between the sidewall 23 of the solder ball slot 22 and the connecting piece 44 of the terminal 40. The transversal plate 51 intrudes into the solder ball 30 and locks up at one side of the solder ball 30.

Figure 12:
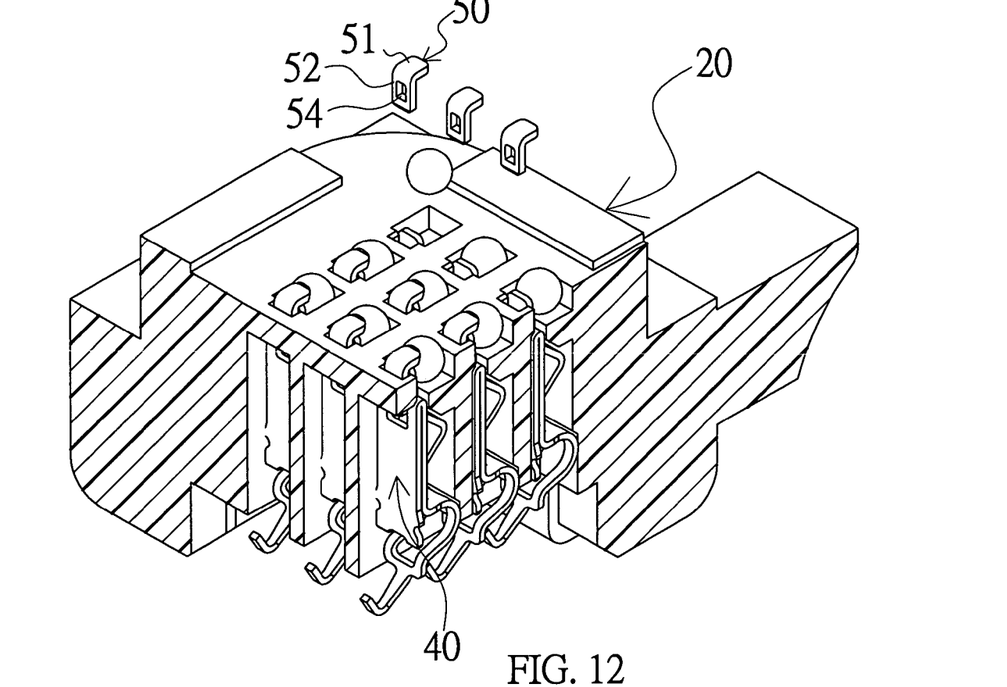
FIG. 12 is a pictorially exploded view showing an electrical connector according to a fifth embodiment of the invention.
Figure 13:
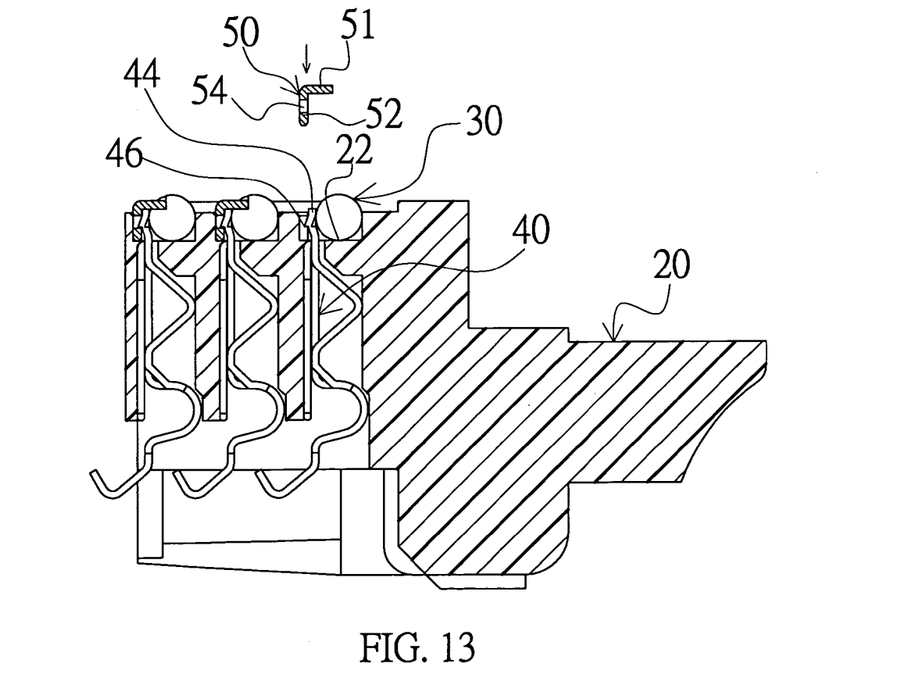
FIG. 13 is a cross-sectional view showing the electrical connector according to the fifth embodiment of the invention.

As shown in FIGS. 12 and 13, the fifth embodiment of the invention is almost the same as the fourth embodiment of the invention except that the longitudinal plate 52 of the locking member 50 is formed with an engagement hole 54 and the connecting piece 44 of the terminal 40 is formed with a barb 46. When the locking member 50 is inserted between a sidewall 23 of the solder ball slot 22 and the connecting piece 44 of the terminal 40, the barb 46 of the connecting piece 44 and the engagement hole 54 of the locking member are locked together.

Figure 14:
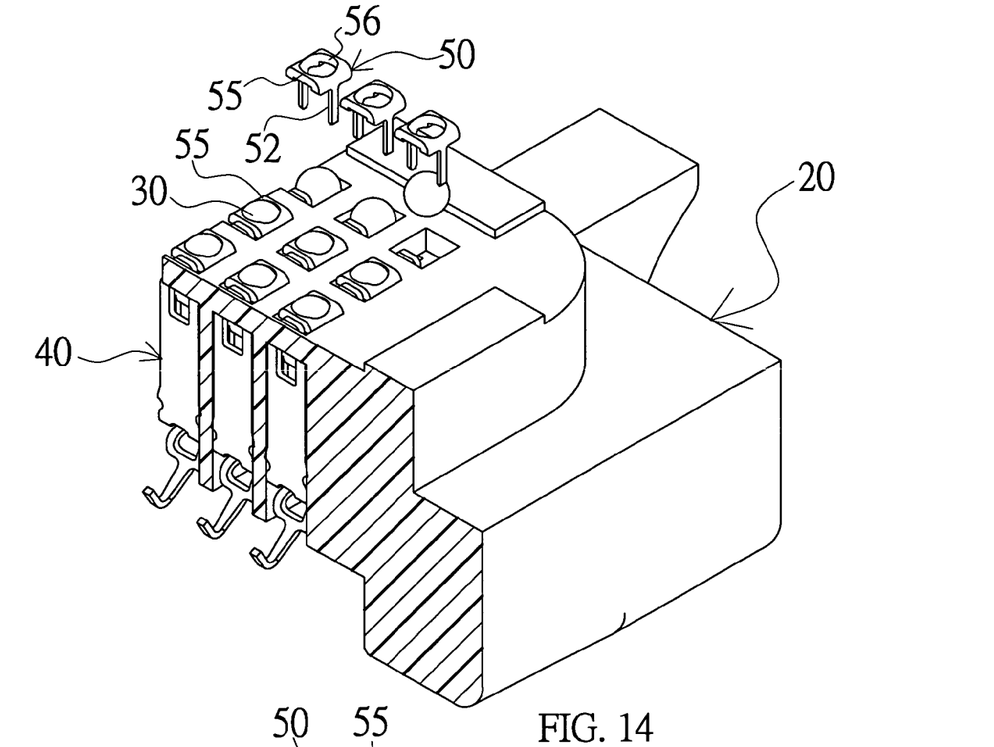
FIG. 14 is a pictorially exploded view showing an electrical connector according to a sixth embodiment of the invention.
Figure 15:
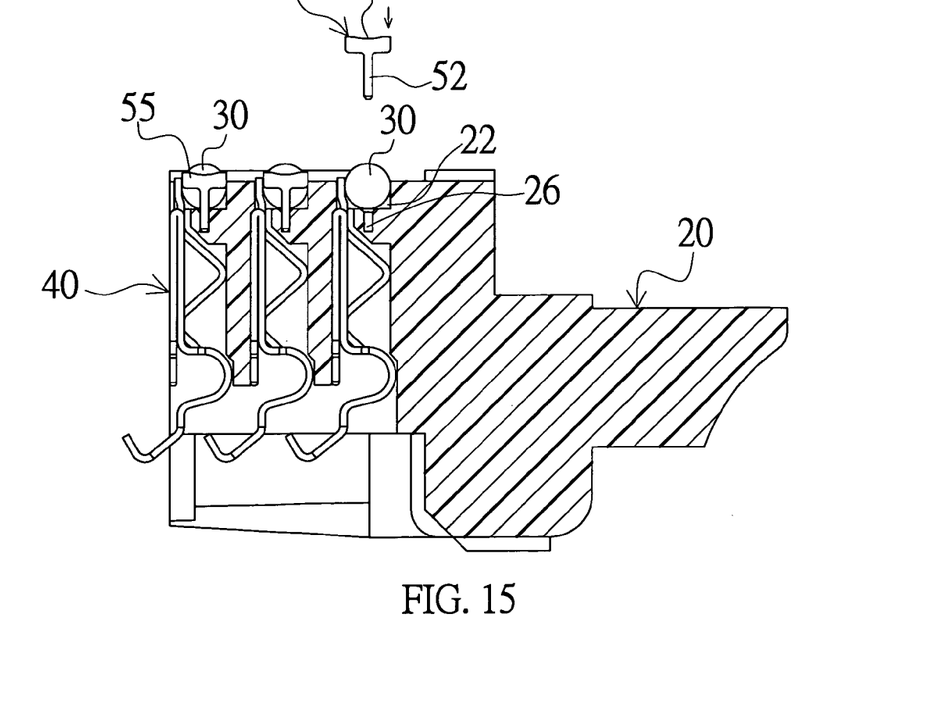
FIG. 15 is a cross-sectional view showing the electrical connector according to the sixth embodiment of the invention.

As shown in FIGS. 14 and 15, the sixth embodiment of the invention is almost the same as the first embodiment of the invention except that the locking member 50 has a locking piece 55 formed with a hole 56 at a middle and two longitudinal parts 52 at two sides. The locking piece 55 tightly presses against a sidewall of the solder ball slot 22 and is inserted into the cavity 26 and then presses against and is fixed in the cavity.

Figure 16:
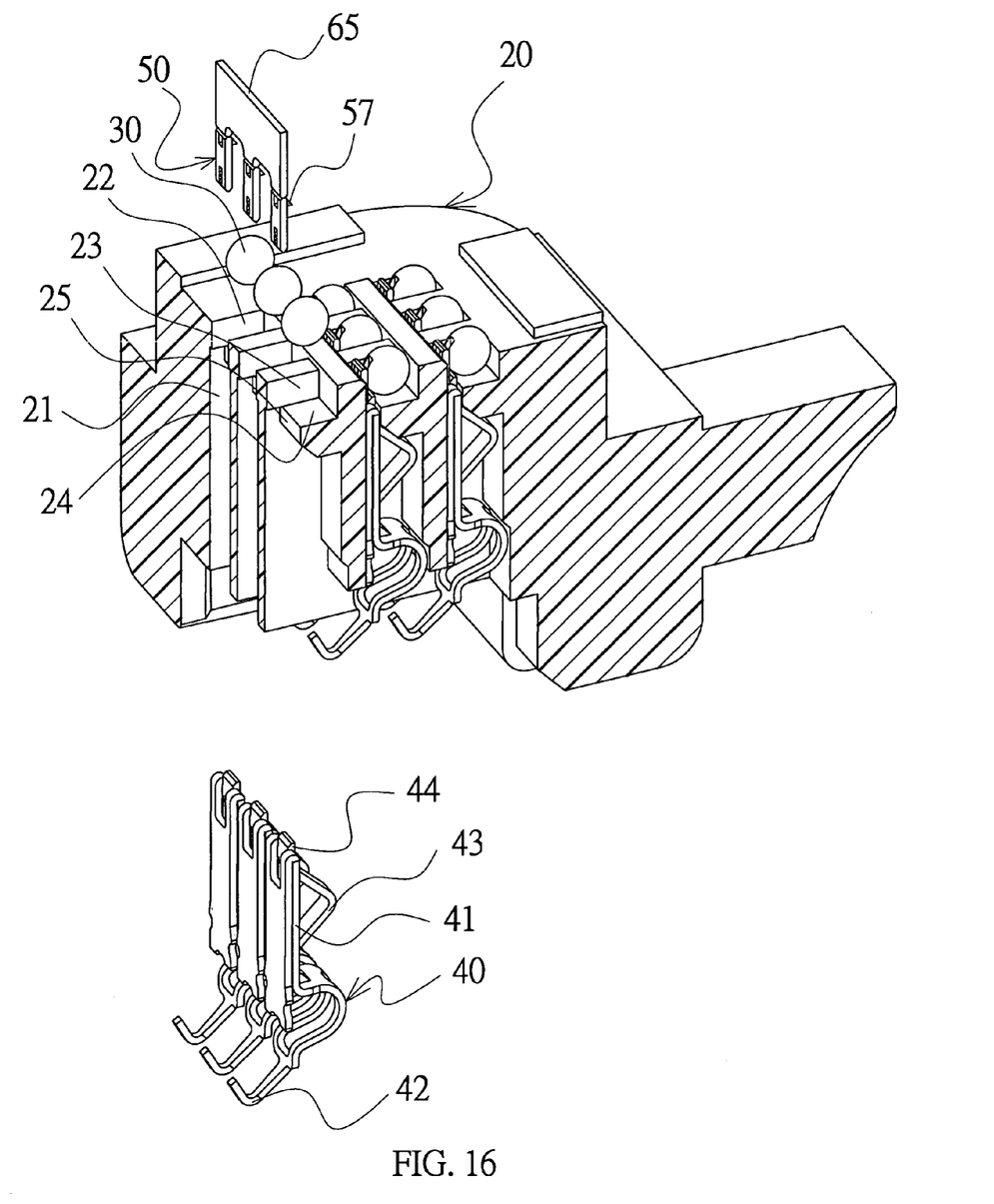
FIG. 16 is a pictorially exploded view showing an electrical connector according to a seventh embodiment of the invention.
Figure 17:
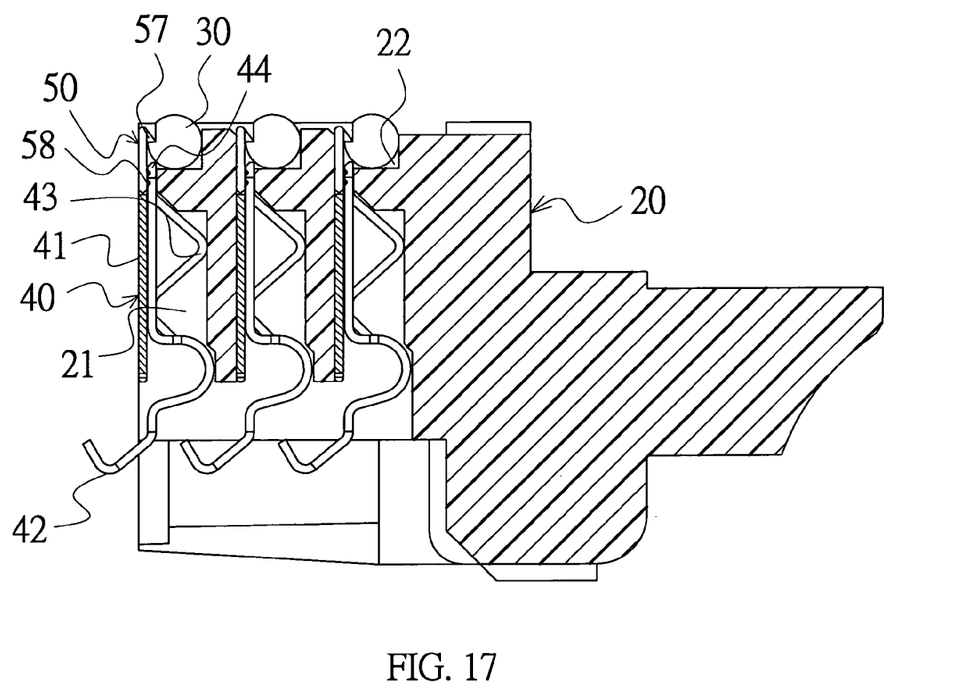
FIG. 17 is a cross-sectional view showing the electrical connector according to the seventh embodiment of the invention.

As shown in FIGS. 16 and 17, an electrical connector according to the seventh embodiment of the invention includes a base 20, solder balls 30, terminals 40 and locking members 50.

The base 20 is formed with a plurality of terminal slots 21 and solder ball slots 22. Each solder ball slot 22 is located under the terminal slot 21. The solder ball slot 22 has a circumferential wall 23 and a bottom surface 24 for separating the solder ball slot 22 from the terminal slot 21. The terminal slot 21 communicates with the solder ball slot 22 at a side through a channel 25.

Each solder ball 30 is disposed in the solder ball slot 22 and rests on the circumferential wall 23. A bottom of each solder ball 30 protrudes beyond the bottom of the base 20.

The terminals 40 are respectively disposed in the terminal slots 21. Each terminal 40 has a fixing portion 41 and a contact 42. The fixing portion 41 includes two folded plates. A pressing portion 43 pressing against the terminal slot 21 is formed on an upper portion of the fixing portion 41 by way of pressing. A connecting piece 44, which extends to the solder ball slot 22 via the channel 25 to contact the solder ball 30, is formed on a lower portion of the fixing portion 41 by way of pressing. The contact 42 extends in a direction toward a top of the terminal slot 21.

One end of the locking member 50 is formed with a barb 57 locking up at one side of the solder ball 30 to prevent the solder ball 30 from escaping out of the solder ball slot 22. The other end of the locking member 50 pokes into the channel 25 such that the locking member 50 is electrically connected to the connecting piece 44. The other end of the locking member 50 is formed with a protruding pressing portion 58 to press against the connecting piece 44 of the terminal.

The connecting piece 44 of the terminal of this embodiment is electrically connected to the solder ball 30 through the locking member 50, so the electrical connection effect may be slightly poorer than those of the above-mentioned embodiments.

Figure 18:
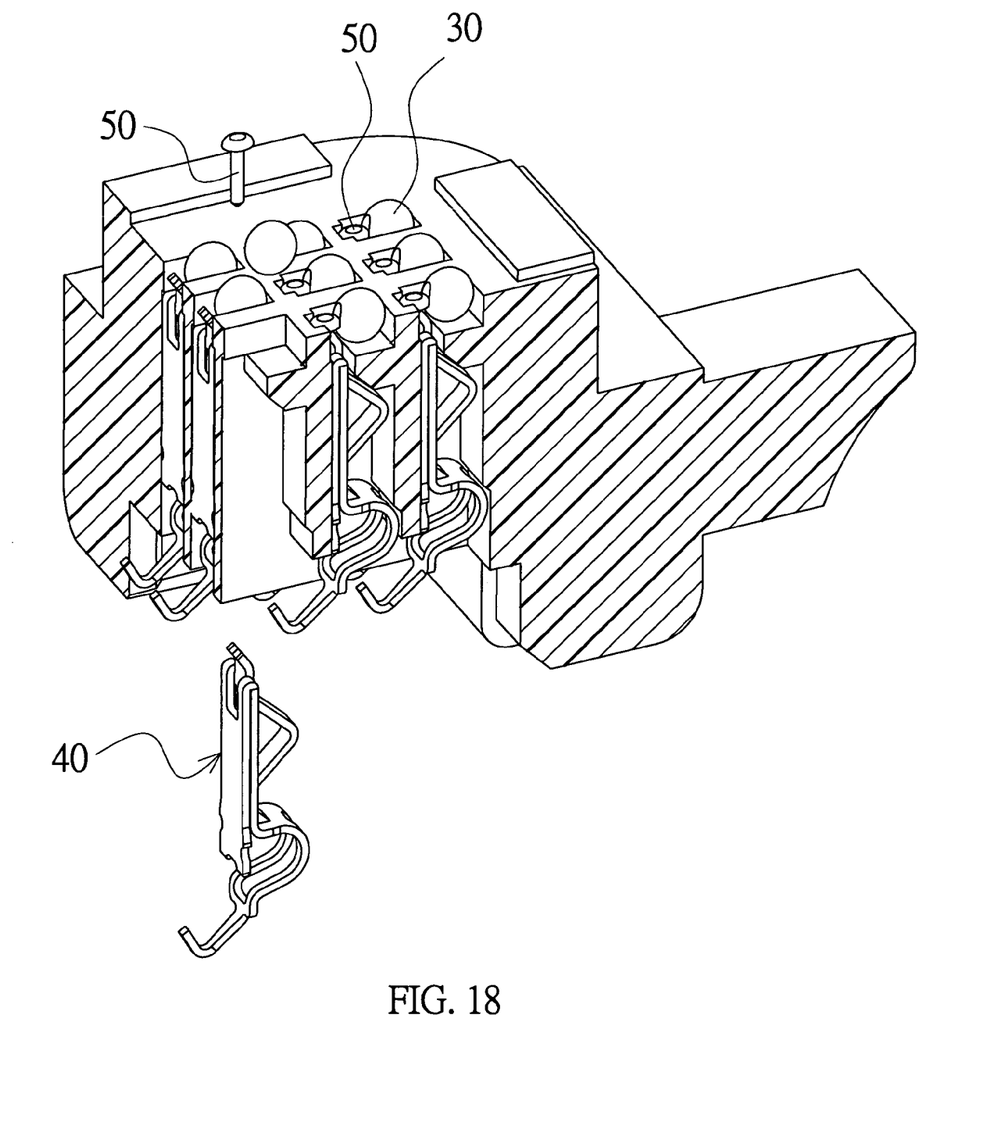
FIG. 18 is a pictorially exploded view showing an electrical connector according to an eighth embodiment of the invention.

As shown in FIG. 18, the eighth embodiment of the invention is almost the same as the seventh embodiment except that the locking member 50 is a rivet. An automatic machine rivets the rivets to the terminal slots automatically, and the rivet heads lock up at one side of the solder ball 30.

Figure 19:
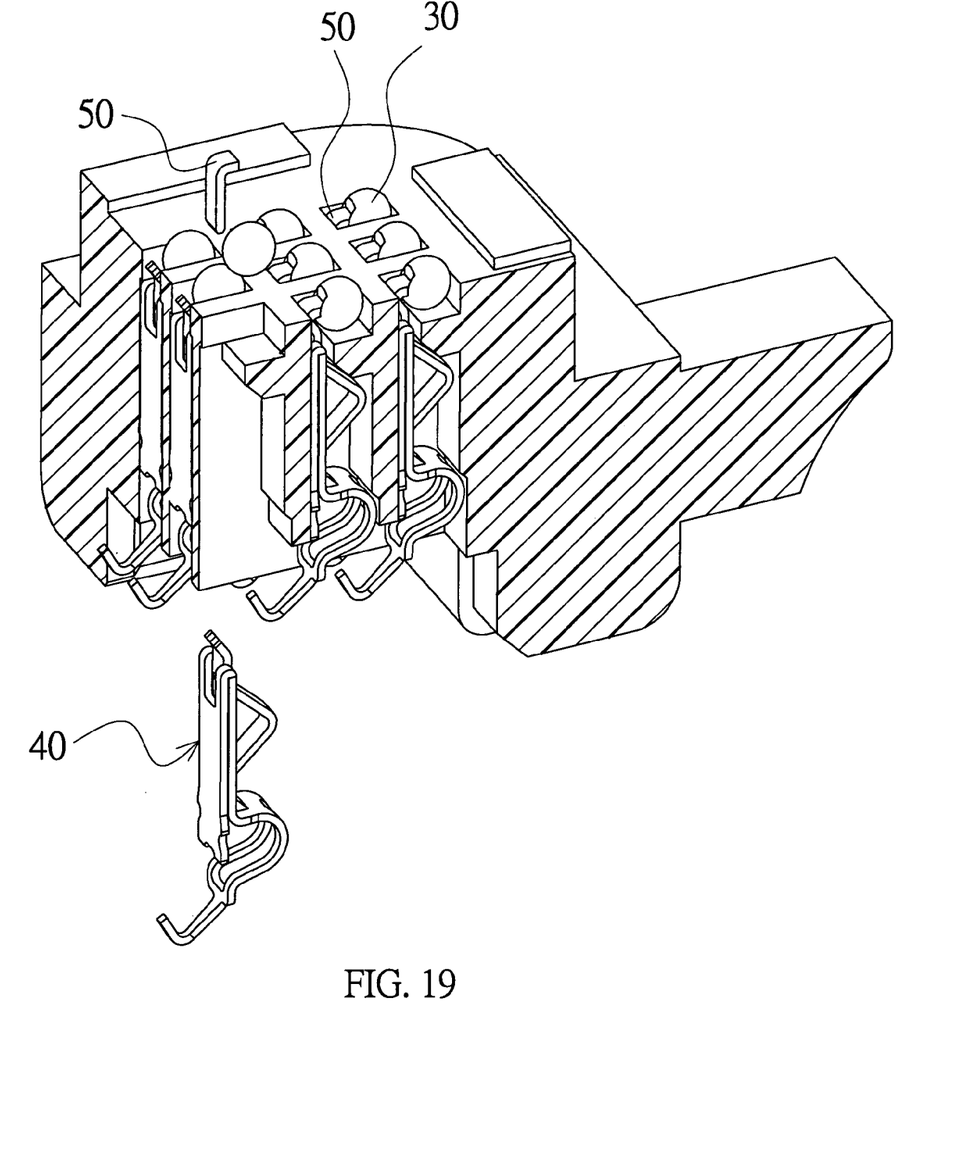
FIG. 19 is a pictorially exploded view showing an electrical connector according to a ninth embodiment of the invention.

As shown in FIG. 19, the ninth embodiment of the invention is almost the same as the eighth embodiment except that the locking member 50 is an L-shaped rivet. The automatic machine rivets the rivets to the terminal slots automatically and the rivet heads lock up at one side of the solder ball 30.

Thus, the invention has the following advantages.

1. The invention utilizes the locking member 50 to lock up at one side of the solder ball 30, so the process of manufacturing the connector is simple because no flux has to be used, no precise alignment of the disposed solder balls is needed, and no hot work is need.

2. The connecting piece 44 of the terminal 40 extends to the solder ball slot 22 to contact the solder ball 30 directly, so it is possible to ensure the electrical connection between the terminal 40 and the solder ball 30.

3. The solder ball 30 is limited by the solder ball slot 22 in conjunction with the locking member 50, so the solder ball 30 can be firmly positioned in the solder ball slot 22 and in direct contact with the connecting piece 42 of the terminal.

4. Two adjacent solder balls 30 are separated by the solder ball slot 22. So, it is possible to prevent the adjacent solder balls 30 from contacting each other to cause the short-circuited phenomenon.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrical connector, comprising:
a base formed with terminal slots and solder ball slots, which respectively correspond to and are located under the terminal slots, wherein the terminal slots respectively communicate with the solder ball slots via channels;
solder balls respectively disposed in the solder ball slots, wherein each of the solder balls has a bottom protruding beyond a bottom of the base, each of the solder balls is disposed on and in contact with a bottom surface of the solder ball slot, and the bottom surface of the solder ball slot is disposed between the terminal slot and the solder ball;
terminals respectively disposed in the terminal slots and electrically connected to the solder balls, the terminals having contacts extending in a direction toward tops of the terminal slots; and
locking members, which are separated from the terminals and respectively inserted into the solder ball slots, each of the locking members locking up at one side of the solder ball to prevent the solder ball from escaping out of the solder ball slot.

2. The electrical connector according to claim 1, wherein each of the locking members has an L shape and comprises a transversal part and a longitudinal part, and the transversal part locks up at the one side of the solder ball.

3. The electrical connector according to claim 1, wherein each of the locking members has an inverse U shape and comprises a transversal part and two longitudinal parts connected to the transversal part, and the transversal part locks up at the one side of the solder ball.

4. The electrical connector according to claim 3, wherein the transversal part of the locking member has a projection protruding toward the solder ball.

5. The electrical connector according to claim 1, wherein the terminal has at least one connecting piece extending to the solder ball slot via the channel to contact the solder ball.

* * * * *